May 21, 1968 V. P. HOLEC 3,384,790

TIMING CIRCUIT EMPLOYING SCR DIODE

Filed Sept. 27, 1965 2 Sheets-Sheet 1

INVENTOR.
VICTOR P. HOLEC

BY Moody and Phillion
ATTORNEYS

May 21, 1968 V. P. HOLEC 3,384,790

TIMING CIRCUIT EMPLOYING SCR DIODE

Filed Sept. 27, 1965 2 Sheets-Sheet 2

INVENTOR.
VICTOR P. HOLEC
BY Moody and Phillion
ATTORNEYS

United States Patent Office 3,384,790

Patented May 21, 1968

3,384,790

TIMING CIRCUIT EMPLOYING SCR DIODE

Victor P. Holec, Cedar Rapids, Iowa, assignor to Collins Radio Company, Cedar Rapids, Iowa, a corporation of Iowa Filed Sept. 27, 1965, Ser. No. 490,544
12 Claims. (Cl. 317—148.5)

This invention relates generally to switching circuit means and, more particularly, to a variable frequency multivibrator type circuit which alternately energizes two relays; the windings of said relays forming an integral part of the variable frequency circuit.

There are in the prior art many uses for multivibrator type (bistable) circuits. Some such circuits operate at high frequencies while others operate at lower frequencies. Of those that operate in the lower frequency ranges, uses are found, for example, in warning flasher lights, metronomes, and generally, in any circuit where periodic switching between two conditions is desirable.

Conventional multivibrators employing two transistors or vacuum tubes, plus necessary RC crossover networks, can be used at comparatively low frequencies. However, such circuits are relatively expensive in that they require many components. Other prior art circuits of the multivibrator type employ charging capacitors which function to trigger gas tubes, thereby discharging capacitors to reestablish the initial condition; i.e., the condition whereby the capacitor can be recharged again.

With the prior art circuits mentioned above, if it is desired to control a circuit having a high-power rating, it is usually necessary to operate a relay means with the output signal from the prior art circuits, and then to use the relays to control the circuit having the higher power rating.

An important object of the present invention is a multivibrator type circuit which employs relay windings as an integral part of the circuit, and by means of which relays, other circuits of a higher power rating can be controlled.

Another object of the present invention is to provide a simple circuit having a variable frequency on-off cycle.

A third purpose of the invention is to provide a simple multivibrator type circuit having a variable frequency on-off cycle and employing a dual coil latching relay as an integral part of the circuit.

A fourth object of the invention is to provide a simple circuit having a variable frequency on-off cycle and capable of asymmetrical flip-flop action.

A further purpose of the invention is the improvement of multivibrator type circuits, generally.

In accordance with the invention a series RC network is connected across a D-C battery source. In parallel with the RC circuit is the series combination of a controllable device such as a silicon-controlled rectifier or some other suitable electron discharge device, and the parallel arrangement of two windings representative of two separate relay means whose armatures are mechanically latched together. Such an arrangement is sometimes referred to as a dual coil latching relay. The two relay windings and associated contacts are arranged so that energization of a given relay winding will disconnect such winding from the battery supply and will condition the other relay winding to be energized on the next cycle of operation. Thus, the two relay windings are alternately energized.

Cycling of operation occurs as follows. A suitable minimum threshold voltage breakdown device, such as a gas tube means, is connected between the junction of the resistor and capacitor of the RC network, and the control electrode of the silicon-controlled rectifier. When the capacitor becomes sufficiently charged, said gas tube breaks down and causes the silicon-controlled rectifier to fire. Firing of the silicon-controlled rectifier energizes one of the two relay windings. Due to the latching together of the armature, the energized relay winding circuit will be opened and the other relay winding will be conditioned to become energized on the next cycle. During the interval of time the armatures of the relays are passing from one contact to another, the main anode circuit of the silicon-controlled rectifier is caused to become opened, and the silicon-controlled rectifier ceases to conduct.

In order to discharge the capacitor in preparation for a subsequent cycle, there is provided a diode means between the junction of the capacitor and resistor of the RC network to the anode of the silicon-controlled rectifier, thus providing a low resistance discharge pass for the capacitor through the connecting diode means and the silicon-controlled rectifier. The discharge of said capacitor is very rapid compared to the time require to energize a relay winding so that substantially complete discharge of the capacitor is obtained well in advance of energization of a relay winding and the subsequent cessation of conduction of the silicon-controlled rectifier.

In accordance with a feature of the invention, the time constant of the RC network can be made to be different on alternate states of the bistable circuit. Thus the time required to charge the capacitor during one stable state of the circuit will be different than that required to charge the capacitor, during the alternate stable states of the circuit, to a value sufficient to break down the gas tube and fire the silicon-controlled rectifier.

The above-mentioned and other objects and features of the invention will be more fully understood from the following detailed description thereof when read in conjunction with the drawings in which.

Figure 1:
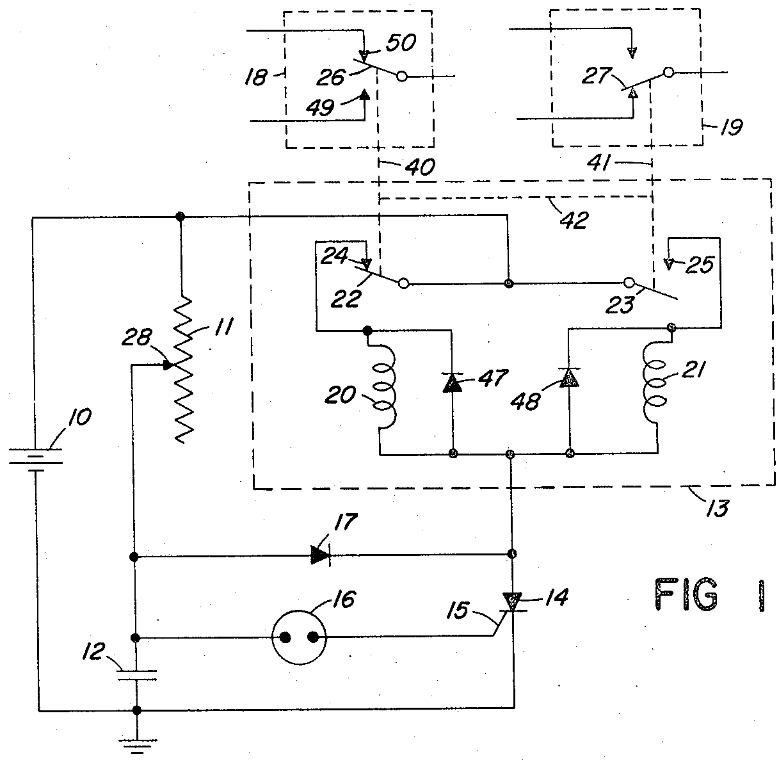
FIG. 1 is a schematic diagram of one form of the invention.

Referring now to FIG. 1, a series RC combination consisting of potentiometer 11 and capacitor 12 is connected across battery source 10. In parallel with the RC circuit is another circuit consisting of a series arrangement of silicon-controlled rectifier 14 and the parallel arrangement of two relays, whose windings are represented by reference characters 20 and 21. Actually, the two relays can be one relay with dual windings, in which the armatures are latched together. More specifically, the armatures 22 and 23 of relays 20 and 21 are latched together through some mechanical means 42, so that when armature 23 is opened armature 22 makes with the contact 23 and, conversely, when armature 22 is opened armature 23 makes with contact 25.

The two circuits in blocks 18 and 19 are auxiliary circuits for control purposes and will be discussed in more detail later.

A gas tube 16 is connected between the control electrode 15 of SCR 14 and the junction between potentiometer tap 28 and capacitor 12. In operation, when capacitor 12 becomes charged to a sufficient and predetermined value by means of battery source 10, gas tube 16 will break down and cause the potential of control electrode 15 to rise, thus causing SCR 14 to become conductive.

When SCR 14 becomes conductive two functions will occur. Firstly, capacitor 12 will discharge through a path consisting of diode 17 and SCR 14. Secondly, a current flow through the energized SCR 14 will thereby be initiated and maintained through one or the other of relay windings 20 or 21. In FIG. 1 armature 22 is shown as being closed on contact 14 so that such current flow would occur through winding 20. The current flow through winding 20 will energize winding 20 and operate both armature 22 and armature 23 so that armature 22 will break with contact 24 and armature 23 will make with contact 25.

During the travel of the armatures, however, there will be a short interval of time when both armatures 22 and 23 will be broken with their respective contacts. During this short time interval the anode current of SCR 14 will be interrupted and the said SCR 14 will become de-energized.

It is to be noted that the amount of time required for the capacitor 12 to discharge is quite short compared to the amount of time required to energize one of the relay windings 20 and 21 so that substantially complete discharge of the capacitor 12 will occur.

The capacitor 12 will then begin to charge again, and the cycle will be repeated. However, when SCR 14 again fires, the current flow will be through relay winding 21 since armature 23 will be making with contact 25 and armature 22 will be disconnected from contact 24.

Figure 3:
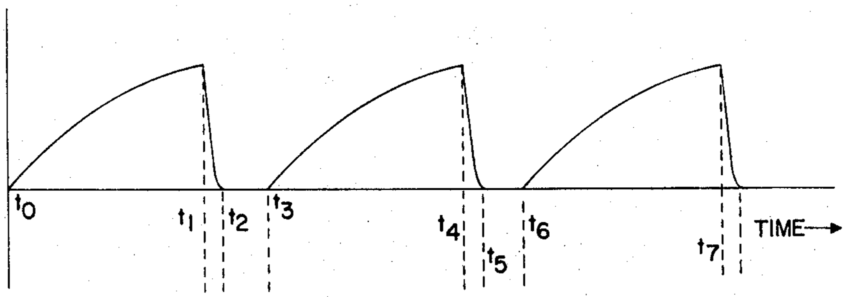
FIG. 3 is a waveform showing three chargings of the capacitor of the RC network over a three-cycle period of operation.
Figure 4:
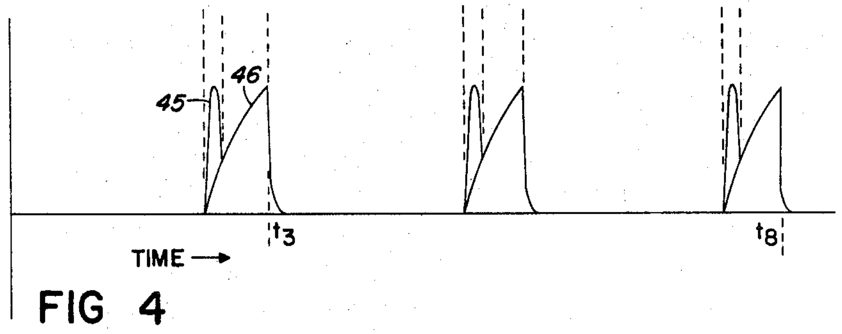
FIG. 4 is a waveform showing the energization of the windings of the dual relay system over three cycles of operation.
Figure 5:
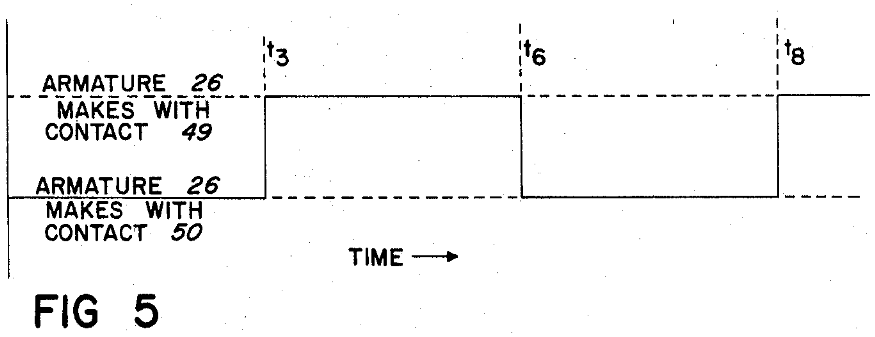
FIG. 5 is a waveform showing the condition of the two stable states of the overall multivibrator circuit over three cycles of operation, as such stable states vary with the waveforms of FIGS. 3 and 4.

Reference is made to the curves of FIGS. 3, 4, and 5 which show the waveforms of the voltages at various points in the circuit. More specifically, FIG. 3 shows the build-up and discharge of the charge on the capacitor 12. For example, at time $t_0$ assume that no charge existed on capacitor 12. Then beginning at time $t_0$ the capacitor 12 will charge through potentiometer 11 until time $t_1$, when it will reach a level sufficient to fire gas tube 16. Almost instantaneously SCR 14 will then fire, as shown at time $t_1$ in FIG. 4. The pulse 45 of FIG. 4 represents the discharge current from capacitor 12 through diode 17 and SCR 14. The curve 46 of FIG. 4 represents the current build-up through relay winding 20 which begins at time $t_1$ when SCR 14 breaks down and becomes conductive. At time $t_3$ the current through relay winding 20 is sufficient to activate armature 22, and also armatures 23, 27, and 26, which are mechanically latched thereto. Thus, at time $t_3$, armature 22 breaks with contact 24 and thereby extinguishes SCR diode 14. The current in relay winding 20 dissipates through diode 47, which is connected thereacross.

FIG. 5 shows the condition of the sets of contacts, as shown in blocks 18 or 19, or one of the contacts such as contact 24 or 25, with consecutive cycles of operation. Assume that the curve of FIG. 5 represents the condition of contacts within the block 18. Then, at time $t_3$ the armature 26 of block 18 breaks with the upper contact 50 and makes with the lower contact 49. At time $t_8$ armature 26 will make with the upper contact 50 and break with the lower contact 49, thus operating in a bistable manner.

At time $t_3$, when armature 22 broke with contact 24, and SCR 14 became extinguished, capacitor 12 immediately began to charge again, as shown in FIG. 3. At time $t_5$ the charge on capacitor 12 was sufficient to again break down gas tube 16 and to fire SCR diode 14. Firing of SCR 14 now produces a current flow through relay winding 21, since armature 23 is now making contact with contact 25. The armatures 23, 22, 27, and 26 operate to assume their other positions at time $t_6$ (i.e., the positions shown in FIG. 1), and a new cycle is initiated.

The switching arrangement of blocks 18 and 19 are shown merely to illustrate the fact that external circuits can be directly controlled from the energization of windings 20 and 21. The switches of blocks 18 and 19 may be employed in any suitable manner.

The frequency of operation of the circuit is determined by the time required to charge capacitor 12 and also the time required to energize windings 20 and 21. It is to be noted that the time required to energize the windings 20 and 21 is relatively fixed, so that the variation in operating frequency must be accomplished by varying the resistance of potentiometer 11, and thus varying the RC time constant of the circuit.

Figure 2:
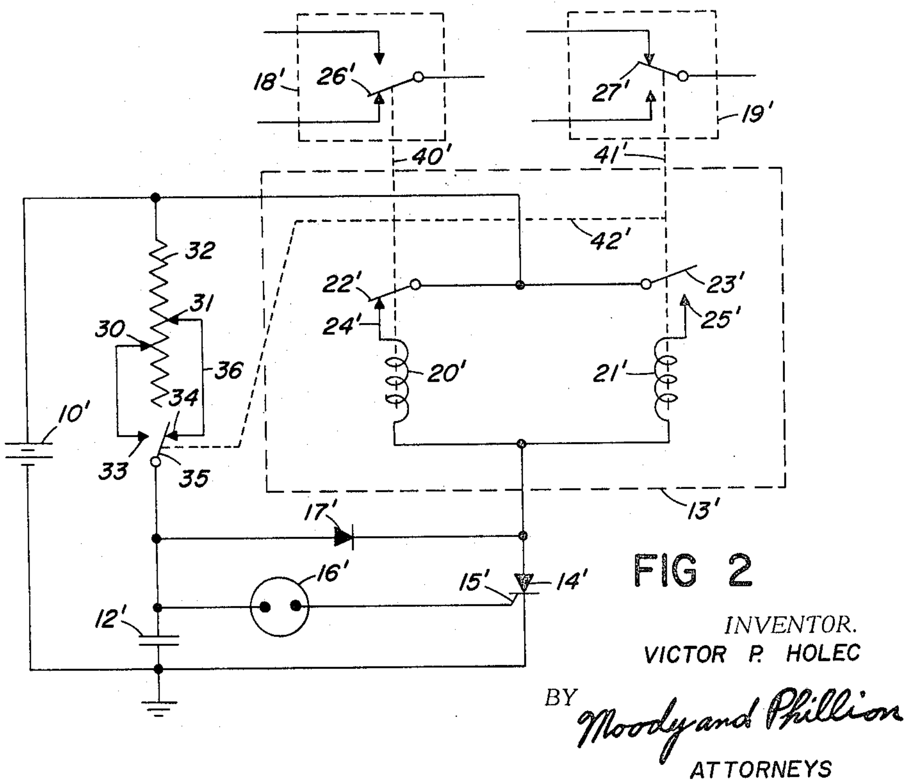
FIG. 2 is a schematic diagram of another form of the invention.

It is possible to provide a asymmetrical flip-flop action, i.e., to have alternate half cycles of operation of a longer or shorter duration than the remaining cycles of operation. Such asymmetrical type operation is accomplished by changing the RC time constant every cycle of operation. A means for changing such RC time constant is shown in FIG. 2. In FIG. 2 most of the components are the same as in FIG. 1 and are identified by similar reference characters, although primed. However, the RC network in FIG. 2 is different from that in FIG. 1. More specifically, the resistance in the RC time constant circuit of FIG. 2 is a potentiometer with two taps thereon. The two taps are identified by reference characters 30 and 31 and are selectively connected into the circuit by means of armature 35 and contacts 33 and 34. The said armature 35 is mechanically latched to armatures 22′ and 23′ of the relay circuit. Each time said relay circuit operates, the armature 35 will change its position, and thus place a new resistive value in series with capacitor 12′.

It is to be noted that the forms of the invention shown and described herein are but preferred embodiments thereof and that various changes may be made in the circuit arrangement and in certain components employed without departing from the spirit or scope of the invention.

I claim:

1. A multivibrator type circuit comprising:
- direct current voltage source means;
- capacitive impedance means comprising a capacitor and connected across said voltage source means;
- the series combination of an electron discharge device and a dual winding latching relay connected across said voltage source means;
- said electron discharge device comprising anode electrode means, cathode electrode means, and electron control electrode means;
- said dual winding latching comprising:
  - first and second winding means each having a first and second terminal with the first terminal thereof connected to an electrode of said electron discharge device;
- and a plurality of contacts and armatures operable to connect the second terminal of one of said winding means to said voltage source means and to disconnect the second terminal of the other winding means from said voltage source means when said other of said winding means is energized;
- minimum threshold voltage breakdown means constructed to energize said electron discharge device when the potential across said capacitor reaches a predetermined value; and
- asymmetrical impedance means to provide a discharge for said capacitor through said electron discharge device when said electron discharge device is energized.

2. A multivibrator type circuit in accordance with claim 1 in which said capacitive impedance means comprises:
- potentiometer means having first and second sliding contacts;
- and switching means for selectively connecting one of said first and second sliding contacts to said capacitive means; and
- coupling means to cause said switching means to switch in response to operation of said first and second winding means.

3. A multivibrator type circuit in accordance with claim 2 in which said electron discharge device comprises a silicon controlled rectifier.

4. A multivibrator type circuit in accordance with claim 3 comprising:
- switching means responsive to energization of one of said first and second windings to perform a switching function external to said multivibrator type circuit means.

5. A multivibrator type circuit in accordance with claim 1 in which said electron discharge device comprises a silicon controlled rectifier.

6. A multivibrator type circuit in accordance with claim 5 comprising:

switching means responsive to energization of one of said first and second windings to perform a switching function external to said multivibrator type circuit means.

7. A multivibrator type circuit comprising:

direct current voltage source means having first and second terminals;

a series arrangement of a resistive means and a capacitive means connected across said direct current voltage source means;

a series arrangement of relay means and an electron discharge device connected across said voltage source;

said electron discharge device comprising anode electrode means, cathode electrode means, and control electrode means;

said relay means comprising first winding means and first contact means operable thereby, and arranged in a first series manner between said electron discharge device and a first terminal of said voltage source means;

said relay means comprising second winding means and second contact means operable thereby, and arranged in a second series manner between said electron discharge device and said first terminal of said voltage supply source, and in parallel with said first series arrangement;

said first and second contact means being latched together to cause one contact means to close when the other contact means is opened;

a minimum threshold voltage breakdown means connected between said control electrode of said electron discharge device, and the junction between said potentiometer and said capacitive means;

and diode means connected between said anode of said electron discharge device and said junction between said potentiometer and said capacitive means.

8. A multivibrator type circuit in accordance with claim 7 in which said resistive means comprises:

potentiometer means having first and second sliding contacts;

and switching means for selectively connecting one of said first and second sliding contacts to said capacitive means;

coupling means to cause said switching means to switch in response to operation of said first and second winding means.

9. A multivibrator type circuit in accordance with claim 8 in which said electron discharge device comprises a silicon controlled rectifier.

10. A multivibrator type circuit in accordance with claim 9 comprising:

switching means responsive to energization of one of said first and second windings to perform a switching function external to said multivibrator type circuit means.

11. A multivibrator type circuit in accordance with claim 7 in which said electron discharge device comprises a silicon controlled rectifier.

12. A multivibrator type circuit in accordance with claim 11 comprising:

switching means responsive to energization of one of said first and second windings to perform a switching function external to said multivibrator type circuit means.

References Cited

UNITED STATES PATENTS

| | | | |
|---|---|---|---|
| 3,209,175 | 9/1965 | Deeg | 307—132 |
| 3,214,644 | 10/1965 | McCoy | 317—148.5 |

MILTON O. HIRSHFIELD, *Primary Examiner.*

J. A. SILVERMAN, *Assistant Examiner.*